(12) United States Patent
Adams et al.

(10) Patent No.: US 8,274,848 B2
(45) Date of Patent: Sep. 25, 2012

(54) LEVEL SHIFTER FOR USE WITH MEMORY ARRAYS

(75) Inventors: Chad A. Adams, Byron, MN (US);
Sharon H. Cesky, Rochester, MN (US);
Elizabeth L. Gerhard, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 234 days.

(21) Appl. No.: 12/849,305

(22) Filed: Aug. 3, 2010

(65) Prior Publication Data
US 2012/0033508 A1 Feb. 9, 2012

(51) Int. Cl.
*G11C 7/00* (2006.01)

(52) U.S. Cl. .............................. 365/189.11; 365/189.15

(58) Field of Classification Search ............. 365/189.11, 365/189.15, 189.16
See application file for complete search history.

(56) References Cited

U.S. PATENT DOCUMENTS

| | | | |
|---|---|---|---|
| 2003/0201673 A1* | 10/2003 | Sim et al. | 307/80 |
| 2004/0036363 A1* | 2/2004 | Sarig et al. | 307/125 |
| 2005/0111264 A1* | 5/2005 | Kim et al. | 365/189.05 |
| 2009/0116307 A1* | 5/2009 | Cottier et al. | 365/189.11 |

\* cited by examiner

*Primary Examiner* — Vu Le
(74) *Attorney, Agent, or Firm* — Dungan & Dungan PC

(57) ABSTRACT

In a first aspect, a level shifter circuit for use in a memory array is provided that includes (1) a first voltage domain powered by a first voltage; (2) a second voltage domain powered by a second voltage; (3) level shifter circuitry that converts an input signal from the first voltage domain to the second voltage domain; and (4) isolation circuitry that selectively isolates the first voltage domain from the second voltage domain so as to selectively prevent current flow between the first voltage domain and the second voltage domain. Numerous other aspects are provided.

20 Claims, 3 Drawing Sheets

LEVEL SHIFTER FOR USE WITH MEMORY ARRAYS

FIELD OF THE INVENTION

The present invention relates generally to memory arrays, and more particularly to level shifter circuitry for use with memory arrays.

BACKGROUND

As memory devices continue to scale, the power supply voltage ($V_{DD}$) employed to power these devices is typically reduced. In some cases, a reduced $V_{DD}$ makes it more difficult to retain stored charge in memory devices such as static random access memories (SRAMs).

To improve the stability and performance of SRAM cells, a separate (higher) power supply voltage called $V_{CS}$ has been introduced in addition to the main chip power supply voltage $V_{DD}$. This secondary, higher voltage $V_{CS}$ provides the voltage required to ensure proper charge storage within memory cells, while allowing the remainder of the devices on a memory chip to operate at a reduced $V_{DD}$.

While use of a separate power supply voltage $V_{CS}$ may improve the charge storage characteristics of SRAMs, other device issues may arise. For example, $V_{CS}$ is typically held at a slightly higher voltage than the chip supply voltage $V_{DD}$. For example, $V_{CS}$ may be about 100 mV to 200 mV higher than $V_{DD}$ in some cases. During device operation, however, $V_{CS}$ may occasionally spike to a higher voltage level, such as about 600 mV or higher above $V_{DD}$. This may prevent transistors within the memory array from turning off, and cause the memory array to fail.

To reduce the affects of voltage spikes in $V_{CS}$, level shifters may be employed to help separate the $V_{CS}$ and $V_{DD}$ voltage domains, and maintain an acceptable voltage differential between $V_{CS}$ and $V_{DD}$. However, some prior art level shifters may generate extraneous currents that deleteriously affect memory array operation. Accordingly, a need exists for improved level shifter circuitry for use with memory arrays.

SUMMARY

In a first aspect of the invention, a level shifter circuit for use in a memory array is provided that includes (1) a first voltage domain powered by a first voltage; (2) a second voltage domain powered by a second voltage; (3) level shifter circuitry that converts an input signal from the first voltage domain to the second voltage domain; and (4) isolation circuitry that selectively isolates the first voltage domain from the second voltage domain so as to selectively prevent current flow between the first voltage domain and the second voltage domain.

In a second aspect of the invention, a memory array is provided that includes (1) read/write circuitry that operates in a first voltage domain; (2) a plurality of memory cells that operate in a second voltage domain that is higher than the first voltage domain; (3) level shifter circuitry that converts an input signal from the first voltage domain to the second voltage domain; and (4) isolation circuitry that selectively isolates the first voltage domain from the second voltage domain so as to selectively prevent current flow between the first voltage domain and the second voltage domain.

In a third aspect of the invention, a method of operating a memory array is provided that includes (1) operating read/write circuitry of the memory array in a first voltage domain; (2) operating a plurality of memory cells of the memory array in a second voltage domain that is higher than the first voltage domain; (3) employing level shifter circuitry of the memory array to convert an input signal of the memory array from the first voltage domain to the second voltage domain; and (4) employing isolation circuitry of the memory array to selectively isolate the first voltage domain from the second voltage domain so as to selectively prevent current flow between the first voltage domain and the second voltage domain. Numerous other aspects are provided.

Other features and aspects of the present invention will become more fully apparent from the following detailed description, the appended claims and the accompanying drawings.

DETAILED DESCRIPTION

As stated, level shifters may be employed to reduce the affects of voltage spikes in $V_{CS}$ by helping to separate the $V_{CS}$ and $V_{DD}$ voltage domains, and maintaining an acceptable voltage differential between $V_{CS}$ and $V_{DD}$. However, prior art level shifters typically are designed with the assumption that $V_{CS}$ will always be higher than $V_{DD}$, which is not guaranteed.

As will be described further below, during a reset, power up or power down operation of a memory array, $V_{CS}$ may fall below $V_{DD}$. If $V_{CS}$ drops below $V_{DD}$ in a conventional level shifter circuit, an extraneous current may be generated between the $V_{DD}$ and $V_{CS}$ voltage domains. Such a current may be referred to as a "crowbar current" and may cause the memory array to operate inefficiently and/or fail.

In accordance with the present invention, power on and/or power off (POR) circuitry (also referred to herein as "isolation circuitry") is provided for a level shifter circuit to prevent the above-described unintended crowbar current should $V_{CS}$ fall below $V_{DD}$ during reset, power up and/or power down of a memory array that employs the level shifter circuit. For example, the POR circuitry provided herein may electrically isolate the two voltage domains $V_{DD}$ and $V_{CS}$ from one another, thereby preventing current flow between the two power supply rails.

The inventive POR circuitry also may drive an internal state of the level shifter circuit to a known state (e.g., a predetermined voltage level) while isolating the two voltage domains $V_{DD}$ and $V_{CS}$. This may be particularly important when the level shifter circuit is used for a wordline driver. Having the level shifter circuit reside in an unknown state may result in multiple wordlines firing at the same time. Memory arrays are designed to operate by firing only one wordline at a time, and firing multiple wordlines even at power on or reset may be problematic (e.g., lead to memory errors and/or device failure). These and other embodiments of the invention are described below with reference to FIGS. 1-4.

Figure 1:
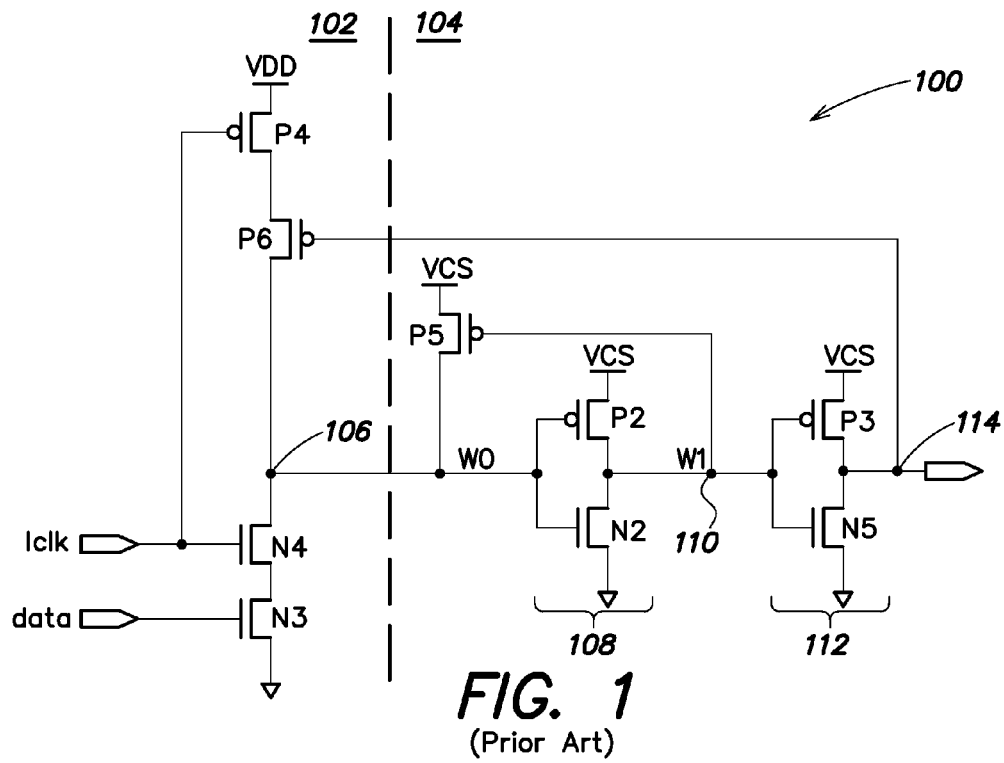
FIG. 1 is a schematic representation of a prior art level shifter.

FIG. 1 is a schematic representation of a conventional level shifter 100 that may be employed within a memory array (not separately shown). In general, numerous level shifter circuits may be employed within a memory array (e.g., one per wordline). The prior art level shifter 100 may include two voltage domains, such as $V_{DD}$ domain 102 and $V_{CS}$ domain 104, with specific voltages $V_{DD}$ and $V_{CS}$, respectively. Exemplary voltages for $V_{DD}$ range from about 0.5 to about 1.5 volts, and exemplary voltages for $V_{CS}$ range from about 1 to about 2 volts, although any other suitable voltages may be used for $V_{DD}$ and/or $V_{CS}$.

Level shifter 100 also include n-channel metal oxide semiconductor field effect transistors (NFETs) N3 and N4 coupled in series between ground and a first node 106, and p-channel metal oxide semiconductor field effect transistors (PFETs) P4 and P6 coupled in series between first node 106 and $V_{DD}$. The gate of NFET N3 serves as a data input DATA, while the gate of NFET N4 serves as a clock input LCLK. The gates of NFET N4 and PFET P4 are coupled together.

A PFET P5 is coupled between first node 106 and $V_{CS}$. NFET N2 and PFET P2 are coupled in series between ground and $V_{CS}$ and serve as a first CMOS inverter 108 between first node 106 and a second node 110. NFET N5 and PFET P3 are coupled in series between ground and $V_{CS}$ and serve as a second CMOS inverter 112 between second node 110 and a third node 114. The gate of PFET P5 is coupled to second node 110, and the gate of PFET P6 is could to third node 114.

$V_{DD}$ domain 102 encompasses those devices of the level shifter 100 that are powered by $V_{DD}$. $V_{DD}$ domain 102 generally encompasses the area to the left of the dotted line. $V_{as}$ domain 104 encompasses those devices of the level shifter 100 that are powered by $V_{CS}$. $V_{CS}$ domain 104 generally encompasses the area to the right of the dotted line.

$V_{DD}$ may be the core logic voltage used in read/write circuits of the memory array (not separately shown) employing level shifter 100. That is, $V_{DD}$ may be the voltage difference from ground used by circuitry of the memory array other than memory cells. $V_{DD}$ may or may not be applied to bit lines. To reduce power consumption of the memory array, $V_{DD}$ may be reduced below what typically would be employed for storing charge within memory cells, while still allowing operation of read/write circuits and other devices of the memory array.

$V_{CS}$ is a memory cell specific voltage, separate and in addition to $V_{DD}$. During normal operation of a memory array, $V_{CS}$ is larger than $V_{DD}$ so as to provide the voltage required to ensure proper charge storage within each memory cell of the memory array. In this manner, memory array stability and performance are improved.

Referring again to FIG. 1, operation of the conventional level shifter 100 is now described.

During normal operation of level shifter 100, $V_{CS}$ is larger than $V_{DD}$, and DATA on the gate of NFET N3 is clocked into level shifter 100 when LCLK goes high on the gate of NFET N4. Specifically, with LCLK high, NFET N4 is on and PFET P4 is off. If DATA is high, NFET N3 is on and first node 106 is pulled low (e.g., to ground). Second node 110 is high and third node 114 is low. With second node 110 high, PFET P5 is off. With third node 114 low, PFET P6 is on.

With LCLK high and DATA low, NFET N3 is off. First node 106 rises from its low voltage due to $V_{DD}$ being dropped across PFET P4 which is off and NFET N3 which is off. Second node 110 switches low, turning PFET P5 on, which pulls first node 106 to $V_{CS}$. Third node 114 switches high to $V_{CS}$ and PFET P6 turns off.

Thus, during normal operation of the level shifter 100, DATA present on the gate of NFET N3 is inverted and output at third node 114. Furthermore, DATA swings between ground and $V_{CS}$ at third node 114 (in $V_{CS}$ domain 104), rather than between ground and $V_{DD}$ as it does in $V_{DD}$ domain 102.

When $V_{CS}$ is larger than $V_{DD}$, level shifter 100 functions as described above. However, if $V_{CS}$ drops below $V_{DD}$, such as during reset, power up or power down of the memory array, an extraneous current may flow between $V_{DD}$ domain 102 and $V_{CS}$ domain 104. Such a current may consume significant power resources and/or damage the memory array. For example, with first node 106 high, second node 110 is low and third node 114 is high. With second node 110 low, PFET P5 is on and first node 106 is held at $V_{CS}$. The gate of PFET P6 is similarly held at $V_{CS}$ by PFET P3 being on (when second node 110 is low). If LCLK is low, PFET P4 is on and the source of PFET P6 is held at $V_{DD}$. If $V_{CS}$ falls below $V_{DD}$ by more than the threshold voltage of PFET P6, PFET P6 will start to turn on, creating a current path from $V_{DD}$ to $V_{CS}$ through PFETs P4, P6 and P5. Accordingly, a large extraneous "crowbar" current may result during each low cycle of LCLK. As stated, such a current may consume significant power resources and/or damage the memory array.

In accordance with the present invention, power on and/or power off (POR) circuitry is provided for a level shifter circuit that prevents the above-described unintended crowbar current should $V_{CS}$ fall below $V_{DD}$ during reset, power up and/or power down of a memory array that employs the level shifter circuit. For example, the POR circuitry may selectively isolate the $V_{DD}$ voltage domain from the $V_{CS}$ voltage domain so as to selectively prevent current flow between the $V_{DD}$ voltage domain and the $V_{CS}$ voltage domain during reset, power up and/or power down of the memory array.

The inventive POR circuitry also may drive an internal state of the level shifter circuit to a known state while isolating the two voltage domains $V_{DD}$ and $V_{CS}$ from one another. This may be particularly important when the level shifter circuit is used for a wordline driver. Having the level shifter circuit reside in an unknown state may result in multiple wordlines firing at the same time. Memory arrays are designed to operate by firing only one wordline at a time, and firing multiple wordlines even at power on or reset may be problematic (e.g., lead to memory errors and/or device failure).

Figure 2:
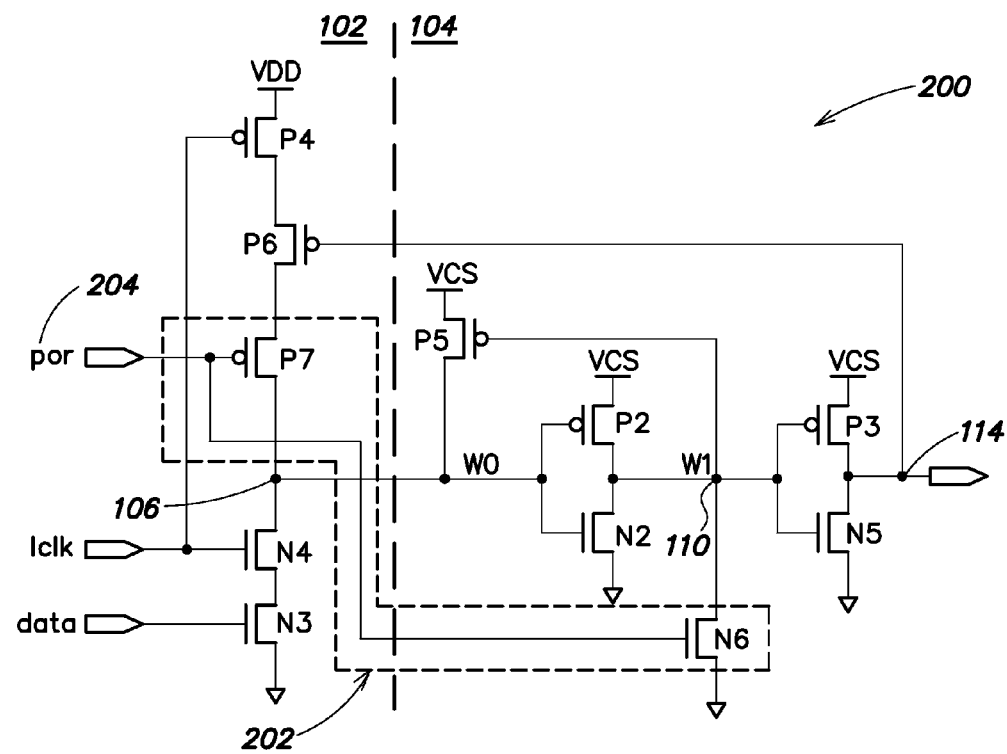
FIG. 2 is a schematic representation of a level shifter in accordance with an embodiment of the present invention.

FIG. 2 is a schematic representation of a level shifter 200 in accordance with an embodiment of the present invention. Level shifter 200 is similar to level shifter 100 of FIG. 1, but includes POR circuitry 202 for preventing crowbar currents between the $V_{DD}$ domain 102 and $V_{CS}$ domain 104.

With reference to FIG. 2, POR circuitry 202 includes PFET P7 coupled in series between NFET N4 and PFET P6, and NFET N6 coupled between second node 110 and ground. The gates of PFET P7 and NFET N6 are coupled together and serve as a POR input 204. In some embodiments, PFET P7 may be replaced with an NFET and NFET P6 may be replaced with a PFET and an opposite polarity POR signal may be applied at POR input 204. In yet other embodiments, other suitable switching devices may be employed in place of PFET P7 and/or NFET N6.

During normal (steady-state) operation of level shifter 200, such as after power up, before power down or any time $V_{CS}$ is greater than $V_{DD}$, the POR circuitry 202 may be disabled by applying a low voltage level to POR input 204. When a low voltage is applied to POR input 204, PFET P7 is on and NFET N6 is off so that these transistors have no affect on the operation of the level shifter 200. Specifically, level shifter 200 will operate similarly to level shifter 100 as described above.

During reset, power on, power off or at any other time when it is believed that $V_{CS}$ may fall below $V_{DD}$, POR circuitry 202 may be employed to isolate $V_{DD}$ domain 102 from $V_{CS}$ domain 104, thereby preventing current flow between the power supply rails. The inventive POR circuitry 202 also may drive an internal state of the level shifter circuit 200 to a known state while isolating the two voltage domains. For example, if a high voltage is applied to POR input 204, PFET P7 is off. This isolates first node 106 from $V_{DD}$ and prevents current flow between $V_{DD}$ domain 102 and $V_{CS}$ domain 104 should PFETs P4, P6 and P5 turn on (as previously described when LCLK is low and $V_{CS}$ falls below $V_{DD}$). Further, with POR input 204 high, NFET N6 is on and second node 110 is pulled to a low voltage level (e.g., ground). This ensures that PFET P5 is on and first node 106 is pulled to $V_{CS}$, and third node 114 is high and the gate of PFET P6 is high (e.g., so that PFET P6 is off unless $V_{CS}$ drops below $V_{DD}$ by more than the threshold voltage of PFET P6). Level shifter 200 thus remains in a known state.

In summary, POR circuitry 202 may be used to isolate PFET P6 from PFET P5 of level shifter 200. When POR input 204 is high, PFET P7 is off, isolating the $V_{DD}$ domain 102 from the $V_{CS}$ domain 104. Although this may succeed in isolating the two voltage domains from one another, it alone may not drive the internal nodes of level shifter 200 to a known state. In order to accomplish this, NFET N6 may be added. When POR input 204 is high, NFET N6 is on, driving internal node 110 to ground, a predetermined or known state. By using POR circuitry 202, $V_{DD}$ domain 102 and $V_{CS}$ domain 104 may be isolated from one another so that extraneous crowbar current will not flow between $V_{DD}$ domain 102 and $V_{CS}$ domain 104 should $V_{CS}$ drop below $V_{DD}$.

Figure 3:
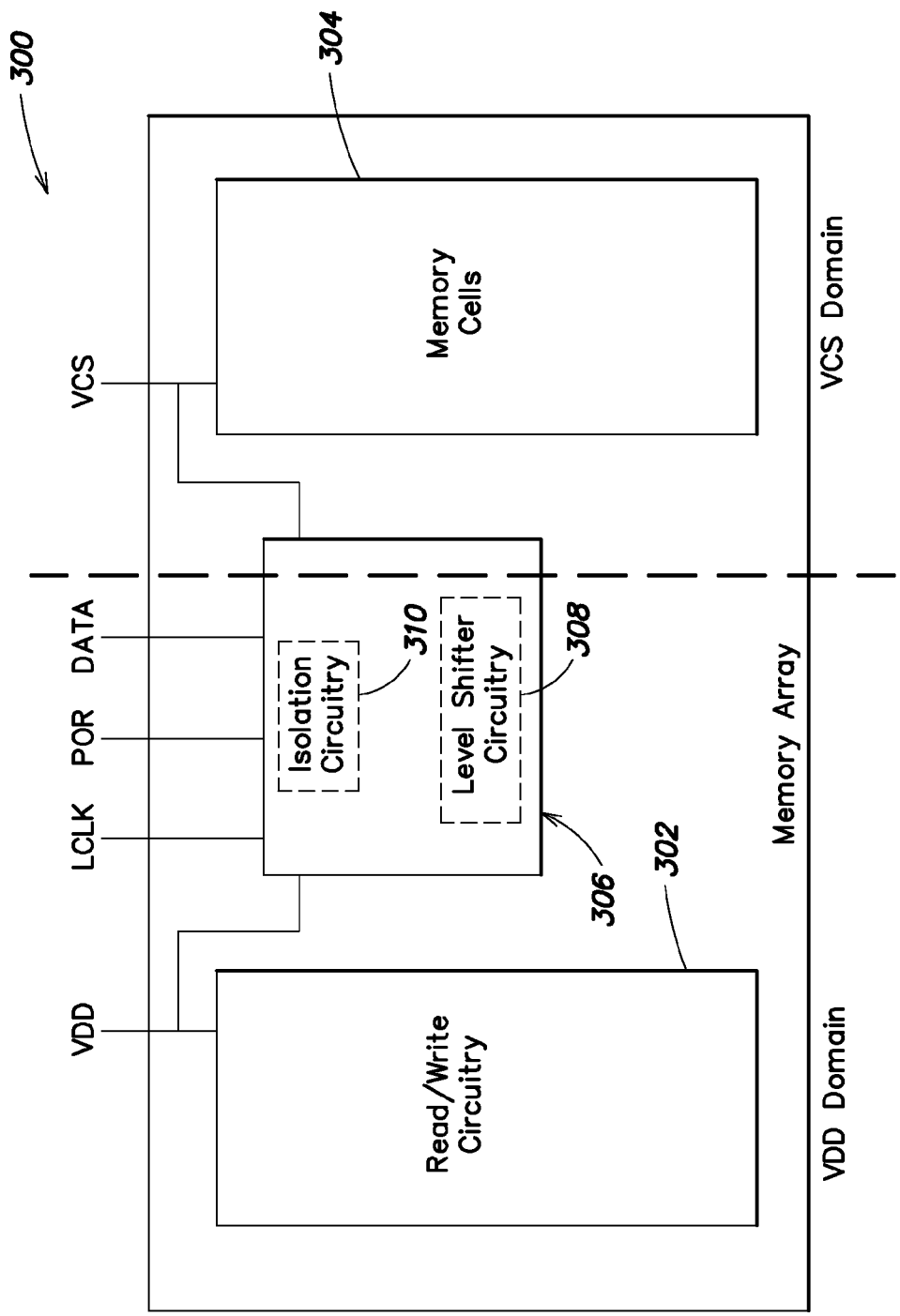
FIG. 3 is a schematic illustration of an exemplary memory array provided in accordance with the present invention.

FIG. 3 is a schematic illustration of an exemplary memory array 300 provided in accordance with the present invention. Memory array 300 includes read/write circuitry 302 for reading data from and/or writing data to a plurality of memory cells 304. Read/write circuitry 302 operates primarily in the $V_{DD}$ voltage domain, while memory cells 304 operate primarily in the $V_{CS}$ voltage domain. Level shifter circuit 306 is provided for converting data and/or other signals from the $V_{DD}$ voltage domain to the $V_{CS}$ voltage domain via level shifter circuitry 308.

Level shifter circuit 306 includes isolation circuitry 310 that may be employed to selectively isolate the $V_{DD}$ and $V_{CS}$ voltage domains in response to a POR input. For example, the $V_{DD}$ and $V_{CS}$ voltage domains may be isolated from one another during reset, power up, power down and/or any other time $V_{CS}$ may drop below $V_{DD}$ so as to avoid extraneous current flow therebetween (as previously described). Level shifter circuit 306 may be similar to the level shifter 200 described previously with reference to FIG. 2. For example, isolation circuitry 310 may be similar to, or the same as, POR circuitry 202 of FIG. 2, and level shifter circuitry 308 may comprise the remaining components of level shifter 200 of FIG. 2. In general, numerous level shifter circuits may be employed within memory array 300 (e.g., one per wordline).

Figure 4:
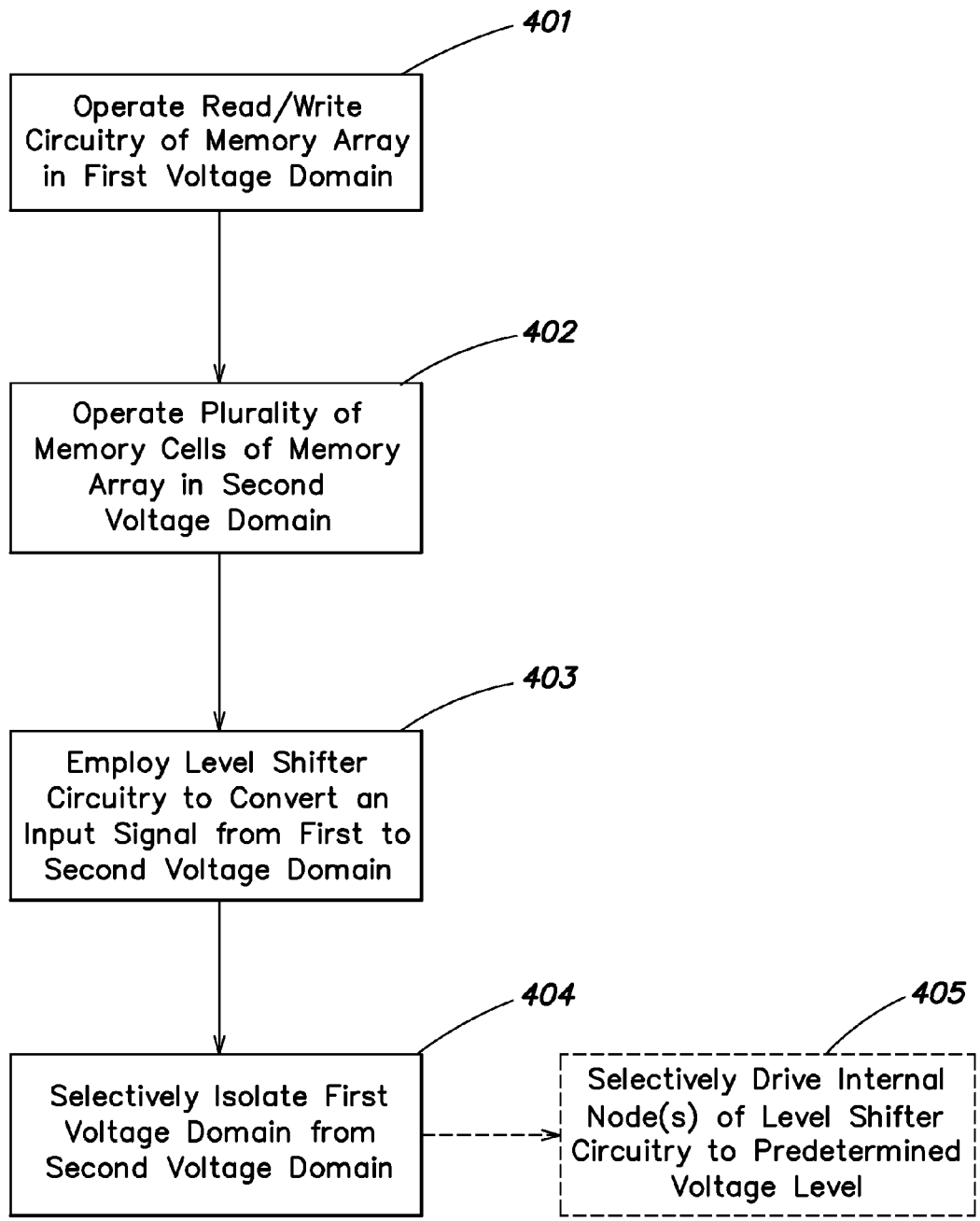
FIG. 4 is a flowchart of an exemplary method of operating the memory array of FIG. 3 in accordance with the present invention.

FIG. 4 is a flowchart of an exemplary method of operating the memory array 300 of FIG. 3 in accordance with the present invention. With reference to FIG. 4, in step 401 read/write circuitry 302 is operated in a first voltage domain (e.g., the $V_{DD}$ voltage domain). For example, read/write circuitry 302 may be powered with a $V_{DD}$ rail voltage.

In step 402, the memory cells 304 are operated in a second voltage domain (e.g., the $V_{CS}$ voltage domain). For example, one or more memory cells may be programmed, erased, and/ or refreshed using a $V_{CS}$ rail voltage.

In step 403, the level shifter circuitry 308 is employed to convert an input signal, such as DATA, from the first voltage domain to the second voltage domain (as previously described with reference to FIG. 2). During steady-state operation of the memory array 300, the voltage $V_{CS}$ is higher than the voltage $V_{DD}$.

In step 404, the isolation circuitry 310 of level shifter circuit 306 may be employed to selectively isolate the first and second voltage domains. For example, the first and second voltage domains may be isolated during reset, power up, power down and/or any other time $V_{CS}$ may drop below $V_{DD}$ so as to avoid extraneous current flow between the two voltage domains (as previously described).

If desired, in step 405, the isolation circuitry 310 also may be employed to selectively drive an internal node of the level shifter circuitry 308 to a predetermined voltage level. For example, an internal node of the level shifter circuitry 308 may be pulled high or low, as described previously with reference to FIG. 2. As mentioned, this may be particularly important when level shifter circuitry 308 is used for a wordline driver.

The foregoing description discloses only exemplary embodiments of the invention. Modifications of the above-disclosed embodiments which fall within the scope of the invention will be readily apparent to those of ordinary skill in the art. For instance, as described, PFET P7 may be replaced with an NFET and NFET P6 may be replaced with a PFET and an opposite polarity POR signal may be applied at POR input 204. In yet other embodiments, other suitable switching devices may be employed in place of PFET P7 and/or NFET N6. Accordingly, while the present invention has been disclosed in connection with exemplary embodiments thereof, it should be understood that other embodiments may fall within the spirit and scope of the invention as defined by the following claims.

The invention claimed is:

1. A level shifter circuit for use in a memory array, comprising:
   a first voltage domain powered by a first voltage;
   a second voltage domain powered by a second voltage;
   level shifter circuitry that converts an input signal from the first voltage domain to the second voltage domain; and
   isolation circuitry that selectively isolates the first voltage domain from the second voltage domain so as to selectively prevent current flow between the first voltage domain and the second voltage domain.

2. The level shifter circuit of claim 1, wherein the first voltage is less than the second voltage during steady-state operation of the level shifter circuit.

3. The level shifter circuit of claim 1, wherein the isolation circuitry includes a first switching device that selectively isolates the first voltage domain from the second voltage domain.

4. The level shifter circuit of claim 3, wherein the first switching device comprises a PFET.

5. The level shifter of claim 3, wherein the isolation circuit includes a second switching device that selectively couples an internal node of the level shifter circuitry to a predetermined voltage level.

6. The level shifter circuit of claim 4, wherein the second switching device is an NFET.

7. A memory array comprising:
   read/write circuitry that operates in a first voltage domain;
   a plurality of memory cells that operate in a second voltage domain that is higher than the first voltage domain;
   level shifter circuitry that converts an input signal from the first voltage domain to the second voltage domain; and
   isolation circuitry that selectively isolates the first voltage domain from the second voltage domain so as to selectively prevent current flow between the first voltage domain and the second voltage domain.

8. The memory array of claim 7, wherein the first voltage is less than the second voltage during steady-state operation of the level shifter circuit.

9. The memory array of claim 7, wherein the isolation circuitry includes a first switching device that selectively isolates the first voltage domain from the second voltage domain.

10. The memory array of claim 9, wherein the first switching device comprises a PFET.

11. The memory array of claim 9, wherein the isolation circuitry includes a second switching device that selectively couples an internal node of the level shifter circuitry to a predetermined voltage level.

12. The memory array of claim 11, wherein the second switching device is an NFET.

13. A method of operating a memory array comprising:
   operating read/write circuitry of the memory array in a first voltage domain;
     operating a plurality of memory cells of the memory array in a second voltage domain that is higher than the first voltage domain;
     employing level shifter circuitry of the memory array to convert an input signal of the memory array from the first voltage domain to the second voltage domain; and
     employing isolation circuitry of the memory array to selectively isolate the first voltage domain from the second voltage domain so as to selectively prevent current flow between the first voltage domain and the second voltage domain.

14. The method of claim 13 wherein employing the isolation circuitry to selectively isolate the first voltage domain from the second voltage domain comprises employing the isolation circuitry to selectively isolate the first voltage domain from the second voltage domain during at least one of reset, power up and power down of the memory array.

15. The method of claim 13 further comprising selectively coupling an internal node of the level shifter circuitry to a predetermined voltage level while employing the isolation circuitry to selectively isolate the first voltage domain from the second voltage domain.

16. The method of claim 13, wherein the first voltage is less than the second voltage during steady-state operation of the level shifter circuitry.

17. The method of claim 13, wherein the isolation circuitry includes a first switching device that selectively isolates the first voltage domain from the second voltage domain.

18. The method of claim 17, wherein the first switching device comprises a PFET.

19. The method of claim 17, wherein the isolation circuitry includes a second switching device that selectively couples an internal node of the level shifter circuitry to a predetermined voltage level.

20. The method of claim 19, wherein the second switching device is an NFET.

* * * * *